(12) United States Patent
Morita et al.

(10) Patent No.: US 10,465,089 B2
(45) Date of Patent: Nov. 5, 2019

(54) VARNISH, PREPREG, FILM WITH RESIN, METAL FOIL-CLAD LAMINATE, AND PRINTED CIRCUIT BOARD

(71) Applicant: HITACHI CHEMICAL COMPANY, LTD., Tokyo (JP)

(72) Inventors: Kouji Morita, Ibaraki (JP); Hikari Murai, Ibaraki (JP); Shin Takanezawa, Ibaraki (JP); Yasuo Inoue, Ibaraki (JP); Kazunaga Sakai, Ibaraki (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 16/124,987

(22) Filed: Sep. 7, 2018

(65) Prior Publication Data

US 2019/0002728 A1    Jan. 3, 2019

Related U.S. Application Data

(60) Division of application No. 14/939,708, filed on Nov. 12, 2015, now abandoned, which is a continuation of
(Continued)

(30) Foreign Application Priority Data

Feb. 24, 2010  (JP) .................................. 2010-039388

(51) Int. Cl.
*C09D 163/00*      (2006.01)
*C08J 5/24*         (2006.01)
(Continued)

(52) U.S. Cl.
CPC ............ *C09D 163/00* (2013.01); *B32B 5/022* (2013.01); *B32B 5/024* (2013.01); *B32B 15/14* (2013.01);
(Continued)

(58) Field of Classification Search
CPC ....................................................... C08L 63/00
See application file for complete search history.

(56) References Cited

U.S. PATENT DOCUMENTS 4,400,438 A    8/1983   Takahashi et al.
5,312,651 A    5/1994   Takada et al.
(Continued)

FOREIGN PATENT DOCUMENTS

EP    1 652 869 A1    5/2006
EP    1 818 350       8/2007
(Continued)

OTHER PUBLICATIONS

English language machine translation of JP 08-134238. Original Japanese document published May 28, 1996. Translation published Jan. 2019 (Year: 1996).*

(Continued)

*Primary Examiner* — Megan McCulley
(74) *Attorney, Agent, or Firm* — Fitch, Even, Tabin & Flannery L.L.P.

(57) ABSTRACT

The invention provides a varnish produced through reaction between a compound having an amino group and a resin having a functional group capable of reacting with an amino group, and having a polycyclic structure, wherein a portion of a plurality of the functional group of the resin is caused to react with the amino group of the compound in a solvent, and also a varnish produced through reaction between a compound having a phenolic hydroxyl group and a resin having a functional group capable of reacting with a phenolic hydroxyl group, and having a polycyclic structure, wherein a portion of a plurality of the functional group of the resin is caused to react with the phenolic hydroxyl group of the compound in the solvent. The invention also provides a prepreg, a resin-coated film, a metal-foil-clad laminate, and
(Continued)

a printed wiring board produced by use of any of the varnishes.

22 Claims, 1 Drawing Sheet

Related U.S. Application Data application No. 13/581,009, filed as application No. PCT/JP2010/063771 on Aug. 13, 2010, now Pat. No. 9,265,145.

(51) Int. Cl.
| | |
|---|---|
| C08G 59/24 | (2006.01) |
| C08G 59/50 | (2006.01) |
| H05K 1/03 | (2006.01) |
| B32B 5/02 | (2006.01) |
| B32B 15/14 | (2006.01) |
| H01L 23/498 | (2006.01) |

(52) U.S. Cl.
CPC ....... *C08G 59/245* (2013.01); *C08G 59/5086* (2013.01); *C08J 5/24* (2013.01); *H05K 1/0346* (2013.01); *H05K 1/0366* (2013.01); *B32B 2255/02* (2013.01); *B32B 2255/26* (2013.01); *B32B 2260/021* (2013.01); *B32B 2260/046* (2013.01); *B32B 2262/0269* (2013.01); *B32B 2262/101* (2013.01); *B32B 2307/306* (2013.01); *B32B 2307/308* (2013.01); *B32B 2307/3065* (2013.01); *B32B 2379/00* (2013.01); *B32B 2457/08* (2013.01); *C08J 2363/00* (2013.01); *H01L 23/49894* (2013.01); *H01L 2224/48227* (2013.01); *H01L 2924/15311* (2013.01); *H01L 2924/3511* (2013.01); *H05K 2201/0355* (2013.01); *H05K 2201/068* (2013.01); *Y10T 428/31678* (2015.04); *Y10T 442/2861* (2015.04); *Y10T 442/2951* (2015.04)

(56) References Cited

U.S. PATENT DOCUMENTS

| 5,368,921 | A | 11/1994 | Ishii et al. |
|---|---|---|---|
| 2002/0119317 | A1 | 8/2002 | Gan et al. |
| 2002/0136911 | A1 | 9/2002 | Yamamoto et al. |
| 2002/0168504 | A1 | 11/2002 | Yamaji et al. |
| 2002/0189949 | A1 | 12/2002 | Tanabe |
| 2003/0044521 | A1 | 3/2003 | Gan et al. |
| 2003/0069357 | A1 | 4/2003 | Kaji et al. |
| 2003/0114574 | A1 | 6/2003 | Furuta et al. |
| 2003/0215746 | A1 | 11/2003 | Kohiyama et al. |
| 2004/0011657 | A1 | 1/2004 | Muramoto et al. |
| 2004/0152804 | A1 | 8/2004 | Inoue |
| 2004/0176563 | A1 | 9/2004 | Shinohara et al. |
| 2006/0058469 | A1 | 3/2006 | Akatsuka et al. |
| 2006/0205861 | A1 | 9/2006 | Gordon et al. |
| 2006/0214341 | A1 | 9/2006 | Sugiura et al. |
| 2006/0280949 | A1 | 12/2006 | Shirakawa et al. |
| 2008/0050596 | A1 | 2/2008 | Urakawa et al. |
| 2008/0064792 | A1 | 3/2008 | Hwang et al. |
| 2008/0145689 | A1 | 6/2008 | Ogawa et al. |
| 2010/0227170 | A1 | 9/2010 | Endo et al. |
| 2010/0292415 | A1 | 11/2010 | Reynolds et al. |
| 2011/0218273 | A1 | 9/2011 | Thibault et al. |

FOREIGN PATENT DOCUMENTS

| EP | 2 113 524 | | 11/2009 |
|---|---|---|---|
| JP | 61-31244 | | 2/1986 |
| JP | S61-098745 | A | 5/1986 |
| JP | 05-051436 | A | 3/1993 |
| JP | 5-239183 | | 9/1993 |
| JP | 6-9752 | | 1/1994 |
| JP | 7-316267 | | 12/1995 |
| JP | 8-134177 | | 5/1996 |
| JP | 08-134236 | A | 5/1996 |
| JP | 8-134238 | | 5/1996 |
| JP | 11-240940 | A | 9/1999 |
| JP | 2000-114727 | | 4/2000 |
| JP | 2000-243864 | | 9/2000 |
| JP | 2001-049083 | | 2/2001 |
| JP | 2003-147051 | A | 5/2003 |
| JP | 2003-277588 | | 10/2003 |
| JP | 2003-277628 | | 10/2003 |
| JP | 2003-342350 | | 12/2003 |
| JP | 2003-342352 | | 12/2003 |
| JP | 2004-182851 | | 7/2004 |
| JP | 2007-2110 | A | 1/2007 |
| JP | 2007-314782 | | 12/2007 |
| JP | 2008-214427 | | 9/2008 |
| JP | 2010-221706 | A | 10/2010 |
| WO | 02/48236 | A1 | 6/2002 |
| WO | 2006/059363 | A1 | 6/2006 |
| WO | 2007/063580 | | 6/2007 |

OTHER PUBLICATIONS

The Extended European Search Report dated Mar. 5, 2017, for European Application No. 10846568.1.
Singapore Official Action dated Jul. 15, 2014, for SG Application No. 2012060984.
Japanese Official Action dated Dec. 17, 2013, for JP Application No. 2010-037253.
Japanese Official Action dated Sep. 24, 2013, for JP Application No. 2010-043764.
Japanese Official Action dated Sep. 3, 2013, for JP Application No. 2010-043026.

* cited by examiner

[Fig. 1]
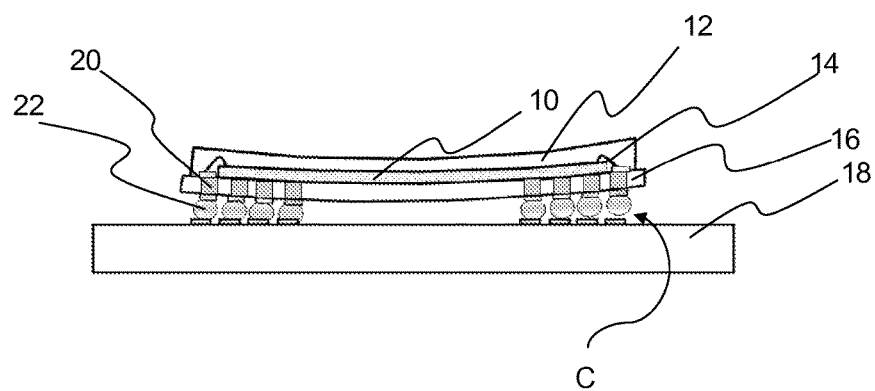
[Fig. 2]
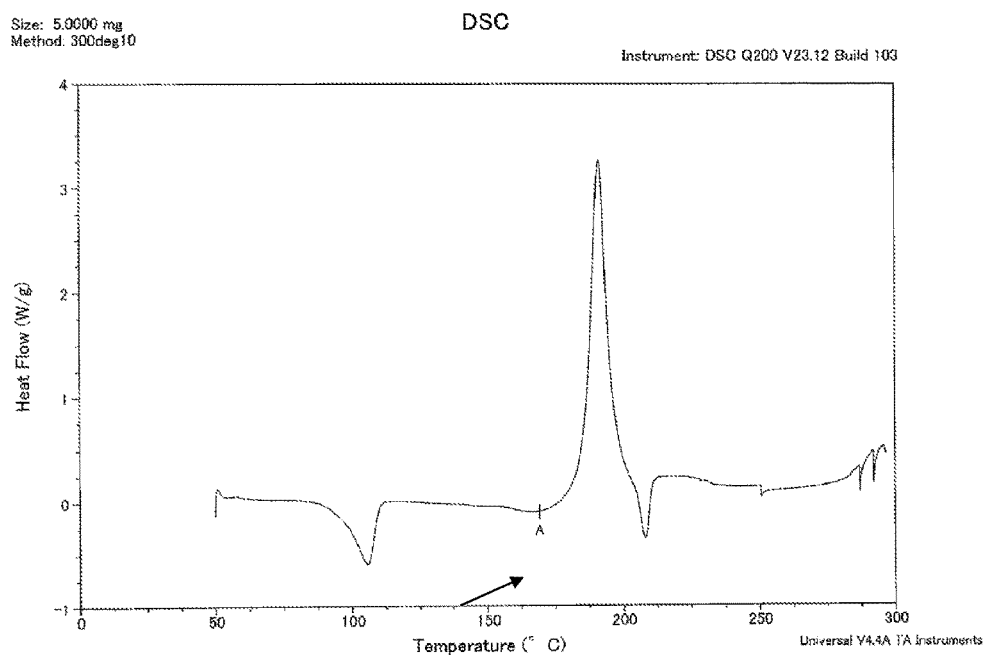

VARNISH, PREPREG, FILM WITH RESIN, METAL FOIL-CLAD LAMINATE, AND PRINTED CIRCUIT BOARD

CROSS-REFERENCE TO RELATED APPLICATIONS

This application is a Divisional Application of U.S. application Ser. No. 14/939,708, filed Nov. 12, 2015, which is a Continuation Application of U.S. application Ser. No. 13/581,009, filed Sep. 19, 2012 (Issued as U.S. Pat. No. 9,265,145), which is a National Stage Application, filed under 35 USC 371, of International (PCT) Application No. PCT/JP2010/063771, filed Aug. 13, 2010, which claims priority from Japanese Application No. 2010-039388, filed Feb. 24, 2010.

TECHNICAL FIELD

The present invention relates to a varnish employed for producing, for example, a laminate or printed wiring board used in electronic devices; to a prepreg produced from the varnish; to a resin-coated film produced from the varnish; to a metal-foil-clad laminate produced by use of the varnish; and to a printed wiring board produced by use of the varnish.

BACKGROUND ART

In recent years, with the progress of small-sized, lightweight electronic devices, printed wiring boards used for such devices have been required to have high-density wiring, which is achieved through, for example, stacking of a large number of thin layers or formation of a micro-wiring pattern. Regarding the realization of high-density wiring in such printed wiring boards, the boards are required to have low thermal expansion coefficient, for the purpose of improving the reliability of micro-wiring patterns on the boards. Particularly when such a wiring board is used as a package substrate, which is a high-density printed wiring board on which a semiconductor device such as a semiconductor chip has been mounted, strict requirements are imposed on the properties of the wiring board, as compared with the case of, for example, a core substrate.

For mounting of a semiconductor device, a flip-chip bonding process has been widely used, in place of a conventional wire bonding process. In the flip-chip bonding process, a wiring board and a semiconductor device are connected by means of a solder ball in place of a wire, which is used in the wire bonding process, to thereby mount the device on the wiring board. This mounting process may be applied to semiconductor packages such as CSP (chip scale package), PoP (package on package), and SiP (system in package).

When an electronic component is connected to a wiring board by means of solder balls, the solder balls and the wiring board are heated to about 300° C. during solder reflow. Generally, the wiring board is formed of a laminate including a metal foil, and a resin-coated film or a prepreg formed from a resin composition and a fibrous substrate or a support, wherein a wiring pattern is formed from the metal foil. Therefore, there may arise problems in that the wiring board expands due to heat; warpage occurs in the wiring board due to the difference in thermal expansion coefficient between the resin forming the wiring board and the electronic component (in particular, a semiconductor device) mounted on the wiring board; and stress is concentrated particularly on the solder balls, which connect the semiconductor device and the wiring board, resulting in cracking and connection failure.

Warpage in a semiconductor package having a PoP structure will be specifically described with reference to FIG. 1. This semiconductor package includes a substrate 18 and a wiring board provided thereon via solder balls 22, wherein the wiring board includes a semiconductor package substrate 16 having through-holes 20, a semiconductor chip 10 electrically connected to the substrate 16 by means of bonding wires 14, and a sealing material 12 provided on the semiconductor chip 10. When heat is applied to the wiring board having this structure, warpage occurs due to the difference in thermal expansion coefficient between the sealing material 12, the chip 10, and the semiconductor package substrate 16, resulting in cracking C.

Under such a circumstance, demand has arisen for a laminate which is less likely to warp and has low thermal expansion coefficient. Conventionally, laminates are generally produced by stacking a plurality of prepregs which have been prepared by impregnation of a glass woven or nonwoven fabric with a resin composition containing an epoxy resin as a main component, followed by drying, and providing a metal foil on one surface or both surfaces of the thus-stacked prepregs, followed by heating and pressurization. Although an epoxy resin is well balanced in terms of, for example, insulating property, heat resistance, and cost, the resin exhibits high thermal expansion coefficient. Therefore, as disclosed in, for example, Patent Document 1, generally, the thermal expansion coefficient of a resin composition is reduced through addition of an inorganic filler such as silica.

The thermal expansion coefficient of the resin composition can be further reduced through incorporation of a larger amount of an inorganic filler. However, when the resin composition is used for producing a multi-layer wiring board or a package substrate, a limitation is imposed on the amount of the inorganic filler incorporated, since the inorganic filler may cause, for example, moisture absorption, poor insulation reliability, adhesion failure between the resin and a wiring layer, and deterioration of drillability.

Patent Document 2 or 3 discloses a technique for reducing the thermal expansion coefficient of a resin composition by increasing the crosslink density and Tg of the resin composition. However, there is a limitation on the maximum crosslink density, since the technique for increasing crosslink density (i.e., the technique for shortening chains of cross-linked molecules) may cause problems in terms of reactivity and resin structure.

Meanwhile, Patent Document 4 discloses an effective technique for reducing the thermal expansion coefficient of a resin composition by employing an epoxy resin having an appropriate molecular weight of a segment between cross-linking points and having a polycyclic structure. However, conventional epoxy resins having a polycyclic structure exhibit low solubility in a solvent due to crystallization of the polycyclic structure caused by intermolecular attraction. Therefore, even when the epoxy resin is dissolved in an organic solvent through heating, the resin is recrystallized after having been cooled to ambient temperature.

Patent Document 5 discloses an effective technique for reducing warpage by employing a resin having a polycyclic structure. Patent Document 5 describes that a resin having a polycyclic structure is effectively employed as a sealing material. In the case where such a resin is employed as a sealing material, the resin is not required to be formed into a varnish, and thus the resin does not cause a problem in terms of recrystallization, which would otherwise occur when the resin is dissolved in an organic solvent.

However, in consideration that a resin having a polycyclic structure is used for producing a laminate, the resin must be dissolved in a solvent to form a varnish immediately before production of the laminate, since, as described above, the resin is very hard to dissolve in an organic solvent, and a varnish formed from the resin exhibits poor storage stability at ambient temperature.

Thus, improvement of the storage stability of a resin having a polycyclic structure at ambient temperature is of great industrial significance, since a varnish containing the resin exhibits improved workability during use thereof.

PRIOR ART DOCUMENT

Patent Document

Patent Document 1: Japanese Patent Application Laid-Open (kokai) No. 2004-182851
Patent Document 2: Japanese Patent Application Laid-Open (kokai) No. 2000-243864
Patent Document 3: Japanese Patent Application Laid-Open (kokai) No. 2000-114727
Patent Document 4: Japanese Patent Application Laid-Open (kokai) No. 2007-314782
Patent Document 5: Japanese Patent Application Laid-Open (kokai) No. 2007-002110

SUMMARY OF THE INVENTION

Problems to be Solved by the Invention

An object of the present invention is to provide a varnish exhibiting high storage stability at ambient temperature and excellent workability during use thereof. Another object of the present invention is to provide a prepreg, a resin-coated film, a metal-foil-clad laminate, and a printed wiring board, each of which is produced from the varnish.

Means for Solving the Problems

The present inventors have conducted extensive studies for achieving the aforementioned objects, and as a result have accomplished the present invention. The present invention provides the following.

[1] A varnish produced through reaction between a compound having an amino group and a resin having a functional group capable of reacting with an amino group, and having a polycyclic structure, wherein a portion of a plurality of the functional group of the resin is caused to react with the amino group of the compound in a solvent.

[2] A varnish according to [1], which is produced through reaction between a compound having a phenolic hydroxyl group and a resin having a functional group capable of reacting with a phenolic hydroxyl group, and having a polycyclic structure, wherein a portion of a plurality of the functional group of the resin is caused to react with the phenolic hydroxyl group of the compound in the solvent.

[3] A varnish according to [1] or [2], wherein the compound having an amino group is any of guanamine, dicyandiamide, and aminotriazine novolak.

[4] A varnish produced through reaction between a compound having a phenolic hydroxyl group and a resin having a functional group capable of reacting with a phenolic hydroxyl group, and having a polycyclic structure, wherein a portion of a plurality of the functional group of the rein is caused to react with the phenolic hydroxyl group of the compound in a solvent.

[5] A varnish according to [2] or [4], wherein the compound having a phenolic hydroxyl group is a phenol novolak resin or a cresol novolak resin.

[6] A varnish according to any of [1] to [5], wherein the resin contains at least one epoxy group serving as the functional group.

[7] A varnish according to any of [1] to [6], wherein the resin has at least one structure selected from the group consisting of a biphenyl structure, a naphthalene structure, a biphenyl novolak structure, an anthracene structure, and a dihydroanthracene structure.

[8] A varnish containing a resin component having a structure represented by the following Formula (1):

Formula (1)

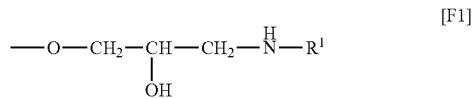

(wherein $R^1$ represents the residue of a compound having an amino group).

[9] A varnish according to [8], wherein the ratio of the molar fraction of the structure represented by formula (1) to the sum of the molar fraction of the structure represented by formula (1) and that of a structure represented by the following Formula (2):

Formula (2)

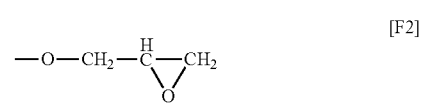

is 40% or less.

[10] A prepreg produced by applying a varnish as recited in any of [1] to [9] to a substrate, and drying the resultant product under heating.

[11] A prepreg according to [10], wherein the substrate a glass woven fabric, a glass nonwoven fabric, an aramid woven fabric, or an aramid nonwoven fabric.

[12] A resin-coated film produced by applying a varnish as recited in any of [1] to [9] to a film, and drying the resultant product under heating.

[13] A metal-foil-clad laminate comprising a prepreg as recited in [10] or [11], and a conductor layer provided on at least one surface of the prepreg.

[14] A metal-foil-clad laminate comprising a resin-coated film as recited in [12], and a conductor layer provided on at least one surface of the film.

[15] A printed wiring board produced by forming a wiring pattern on the conductor layer provided on at least one surface of a metal-foil-clad laminate as recited in [13] or [14].

Effects of the Invention

According to the present invention, there can be provided a varnish exhibiting high storage stability at ambient temperature and excellent workability during use thereof, as well as a prepreg, a resin-coated film, a metal-foil-clad laminate, and a printed wiring board, each of which is produced from the varnish.

BRIEF DESCRIPTION OF THE DRAWINGS

FIG. 1 shows the state of warpage in a semiconductor package having a PoP structure.
FIG. 2 shows a DSC curve obtained in the case where the ratio by equivalent of YX-8800 to dicyandiamide is 1:1.

BEST MODES FOR CARRYING OUT THE INVENTION

[1] Varnish:

A first varnish of the present invention is produced through reaction between a compound having an amino group and a resin having a functional group capable of reacting with an amino group, and having a polycyclic structure, wherein at least a portion of a plurality of the functional group is caused to react with the amino group in a solvent.

The first varnish of the present invention is also regarded as a varnish containing a resin component having a structure represented by the following formula (1):

Formula (1)

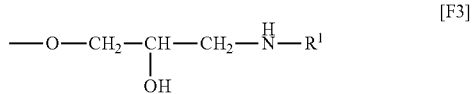

[F3]

In formula (1), $R^1$ represents the residue of a compound having an amino group. The compound having an amino group will be described hereinbelow.

A second varnish of the present invention is produced through reaction between a compound having a phenolic hydroxyl group and a resin having a functional group capable of reacting with a phenolic hydroxyl group, and having a polycyclic structure, wherein at least a portion of a plurality of the functional group is caused to react with the phenolic hydroxyl group in a solvent. The compound having a phenolic hydroxyl group will be described hereinbelow.

As used herein, "resin having a functional group capable of reacting with an amino group, and having a polycyclic structure" or "resin having a functional group capable of reacting with a phenolic hydroxyl group, and having a polycyclic structure" may be referred to as "resin having a polycyclic structure."

The first varnish or second varnish of the present invention (hereinafter these varnishes may be collectively referred to simply as "the varnish of the present invention") is produced by dispersing, in a solvent, a resin having a polycyclic structure and a compound having an amino group or a phenolic hydroxyl group, and causing the resin to react with the compound through, for example, heating. Thus, the solubility of the resin having a polycyclic structure in the solvent is improved, and the varnish can be stored for a long period of time. Since an additive or the like is not required to be incorporated for improving the solubility of the resin, properties of the resin are less likely to be impaired; i.e., the resin maintains its properties for a long period of time.

The varnish of the present invention will next be described in detail.

(Resin Having Polycyclic Structure)

As used herein, the "polycyclic structure" of the resin refers to a structure formed through bonding of aromatic rings via a single bond, or a structure formed through condensation of aromatic rings.

Examples of the structure formed through bonding of aromatic rings via a single bond include a biphenyl structure, a biphenyl novolak structure, and a terphenyl structure.

Examples of the structure formed through condensation of aromatic rings include a naphthalene structure, a naphthalene novolak structure, an anthracene structure, a dihydroanthracene structure, a phenanthrene structure, a tetracene structure, a chrysene structure, a triphenylene structure, a tetraphene structure, a pyrene structure, a picene structure, and a perylene structure.

The aforementioned structures may be employed singly or in combination of two or more species. In order to improve properties (e.g., thermal expansion property and heat resistance) of the laminates, printed wiring boards, mounted boards, etc. produced from the varnish of the present invention, the polycyclic structure is preferably a biphenyl structure, a biphenyl novolak structure, a naphthalene structure, a naphthalene novolak structure, an anthracene structure, a dihydroanthracene structure, or the like, more preferably a biphenyl structure, a biphenyl novolak structure, a naphthalene structure, an anthracene structure, or a dihydroanthracene structure. Such a structure is preferably employed, since the structure is three-dimensionally fixed, and thus stacking can be readily carried out.

The resin having a polycyclic structure is preferably a thermosetting resin, from the viewpoints of high fluidity during heating, as well as heat resistance and dimensional stability after curing. Examples of the thermosetting resin include an epoxy resin and a cyanate resin. In order to achieve high productivity and easy handling, the thermosetting resin is preferably an epoxy resin.

In the case where an epoxy resin is employed, the epoxy group of the resin is a functional group capable of reacting with an amino group or a phenolic hydroxyl group.

From the viewpoint of moldability, the epoxy resin is preferably a naphthalene novolak epoxy resin or a biphenyl novolak epoxy resin. Meanwhile, from the viewpoint of low thermal expansion property, the epoxy resin is preferably a naphthalene epoxy resin, an anthracene epoxy resin, or a dihydroanthracene epoxy resin. These resins may be employed singly or in combination of two or more species. In order to exert the performance of such resins, the total amount of the resins employed is preferably 30 mass % or more, more preferably 50 mass % or more, on the basis of the entirety of the epoxy resin.

Specific examples of preferred epoxy resins will next be described.

The biphenyl novolak epoxy resin is preferably an epoxy resin represented by the following formula (3). The epoxy resin having a structure represented by the following formula (3) is commercially available as, for example, NC-3000 (product of Nippon Kayaku Co., Ltd.)

Formula (3)

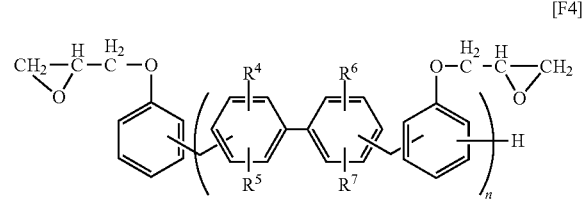

[F4]

In formula (3), each of $R^4$ to $R^7$, which may be the same as or different from one another, represents hydrogen or an alkyl group, and n is a number satisfying the following relation: n>0, preferably 1.5≤n≤4.0.

The naphthalene novolak epoxy resin is preferably an epoxy resin having a structure represented by the following formula (4). The epoxy resin having a structure represented by the following formula (4) is commercially available as, for example, ESN-175 (product of Tohto Kasei Co., Ltd.).

Formula (4)

[F5]

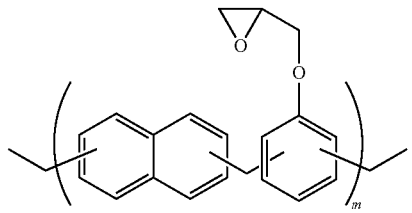

In formula (4), m is a number satisfying the following relation: m>0, preferably 2≤m≤7.

The dihydroanthracene epoxy resin is preferably an epoxy resin having a structure represented by the following formula (5). The epoxy resin having a structure represented by the following formula (5) is commercially available as, for example, YX-8800 (product of Japan Epoxy Resin).

Formula (5)

[F6]

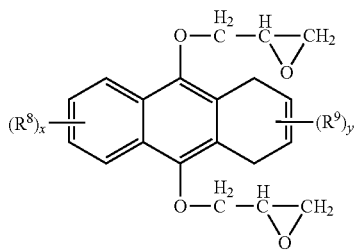

In formula (5), each of $R^8$ and $R^9$, which may be the same as or different from each other, represents an alkyl group having 4 or less carbon atoms; x is an integer from 0 to 4; and y is an integer from 0 to 6.

The anthracene epoxy resin is preferably an epoxy resin having a structure represented by the following formula (6).

Formula (6)

[F7]

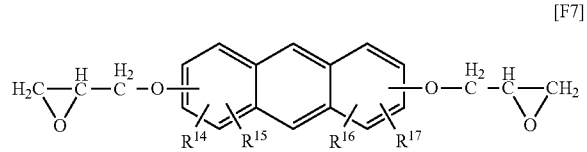

In formula (6), $R^{14}$ to $R^{17}$ have the same meanings as $R^4$ to $R^7$ in formula (3).

(Compound Having Amino Group)

The compound having an amino group employed in the present invention has at least one amino group in the molecule. When, for example, "the reactive group equivalent of a compound having an amino group": "the epoxy equivalent of an epoxy resin having a polycyclic structure" is 1:1, the exothermic onset temperature is preferably 60° C. to 200° C., more preferably 70° C. to 190° C., particularly preferably 80° C. to 180° C. When the exothermic onset temperature falls within the above range, curing reaction does not proceed rapidly at ambient temperature, and thus the resultant varnish exhibits improved pot life (storage stability).

The exothermic onset temperature may be determined through DSC (differential scanning calorimetry). Specifically, the exothermic onset temperature may be determined as shown in FIG. 2 (i.e., a rising point (point A) of a DSC curve obtained in the case where the ratio by equivalent of YX-8800 to dicyandiamide is 1:1).

Examples of the compound having an amino group include guanamines such as benzoguanamine, acetoguanamine, and spiroguanamine; guanamine resins derived therefrom; dicyandiamide; melamine and melamine resins derived therefrom; triethylenetetramine; and aminotriazine novolak resin. The molecular weight of such a compound is preferably 60 or more, more preferably 80 or more. When the compound having an amino group has such a molecular weight, the compound is sufficiently bulky for preventing molecular alignment and crystallization of a resin having a polycyclic structure in the case where the compound reacts and bonds with the resin. Several types of compounds having an amino group may be employed in combination. Among the aforementioned compounds, benzoguanamine, dicyandiamide, or aminotriazine novolak resin is preferably employed, from the viewpoints of, for example, thermal expansion property, heat resistance, and reliability after formation of a laminate.

The residue of the compound having an amino group represented by $R^1$ in formula (1) is, for example, the residue of any of the above-exemplified resins and compounds.

(Compound Having Phenolic Hydroxyl Group)

The compound having a phenolic hydroxyl group employed in the present invention has one or more hydroxyl groups in the molecule. From the viewpoint of cross-linking, more preferably, the compound has two or more hydroxyl groups in the molecule. Examples of the compound having a phenolic hydroxyl group include naphthalenediol, phenol novolak resin, cresol novolak resin, bisphenol A novolak resin, aminotriazine novolak resin, bismaleimide-containing aminotriazine novolak resin, bisphenol A, and bisphenol F. Of these, phenol novolak resin or cresol novolak resin is preferably employed. No particular limitation is imposed on the molecular weight of such a compound. Several types of such compounds may be employed in combination.

When "the reactive group equivalent of a compound having a phenolic hydroxyl group": "the epoxy equivalent of an epoxy resin having a polycyclic structure" is 1:1, the exothermic onset temperature is preferably 60° C. to 200° C., more preferably 70° C. to 190° C., particularly preferably 80° C. to 180° C. When the exothermic onset temperature falls within the above range, curing reaction does not proceed rapidly at ambient temperature, and thus the resultant varnish exhibits improved pot life (storage stability).

When a compound having a phenolic hydroxyl group is employed, as described hereinbelow, a curing promoter is employed in combination.

Upon reaction in a solvent, the compound having a phenolic hydroxyl group may be employed in combination with a compound having an amino group. In this case, the amount of the compound having a phenolic hydroxyl group is preferably 0.01 to 100 equivalents, more preferably 0.03 to 30 equivalents, on the basis of 1 equivalent of the compound having an amino group. When the amount of the compound having a phenolic hydroxyl group is 0.05 to 20 equivalents on the basis of 1 equivalent of the compound having an amino group, effective reaction can be allowed to proceed between the compound having a phenolic hydroxyl group, the compound having an amino group, and the thermosetting resin.

When "the reactive group equivalent of a compound having a phenolic hydroxyl group and a compound having an amino group": "the epoxy equivalent of an epoxy resin having a polycyclic structure" is 1:1, the exothermic onset temperature is preferably 60° C. to 200° C., more preferably 70° C. to 190° C., particularly preferably 80° C. to 180° C. When the exothermic onset temperature falls within the above range, curing reaction does not proceed rapidly at ambient temperature, and thus the resultant varnish exhibits improved pot life (storage stability).

(Resin Component Having Structure Represented by Formula (1))

The resin component employed in the present invention and having a structure represented by formula (1) may be produced through reaction between any of the aforementioned epoxy resins having a polycyclic structure and a compound having an amino group in a solvent. Specifically, the resin component having a structure represented by formula (1) may be produced through reaction between at least a portion of epoxy groups of the epoxy resin and the amino group of the amino-group-having compound.

Examples of the structure represented by formula (1) will next be described.

The resin component produced from a biphenyl novolak epoxy resin represented by formula (3) and a compound having an amino group has a structure represented by the following formula (7).

Formula (7)

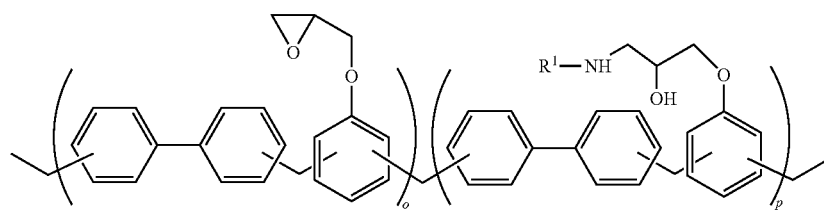

In formula (7), $R^1$ has the same meaning as defined above in formula (1) (the same shall apply hereinafter); o is a number satisfying the following relation: o>0; and p is a number satisfying the following relation: p>0.

The resin component produced from a naphthalene novolak epoxy resin represented by formula (4) and a compound having an amino group has a structure represented by the following formula (8).

Formual (8)

[F9]

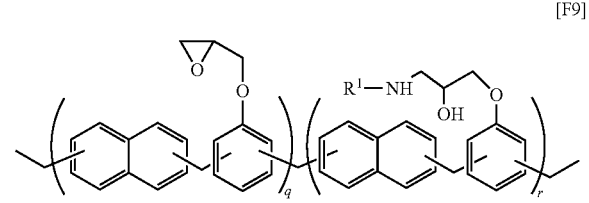

In formula (8), q is a number satisfying the following relation: q>0, and r is a number satisfying the following relation: r>0.

The resin component produced from a dihydroanthracene epoxy resin represented by formula (5) and a compound having an amino group includes one having a structure represented by the following formula (9).

Formula (9)

[F10]

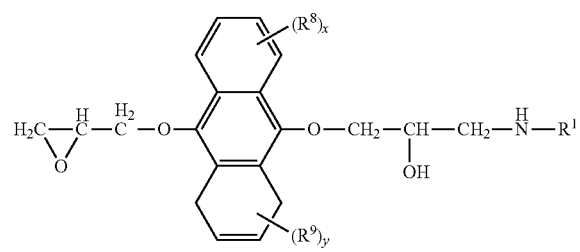

In formula (9), $R^8$ and $R^9$ have the same meanings as those described in formula (5), and x and y have the same meanings as those described in formula (5).

In the varnish of the present invention, the ratio of the molar fraction of a structure; i.e., a resin component, represented by formula (1) to the sum of the molar fraction of the structure represented by formula (1) and that of a structure represented by the following formula (2) is preferably 40% or less, more preferably 5% to 40%, much more preferably 8% to 40%, particularly preferably 10% to 35%.

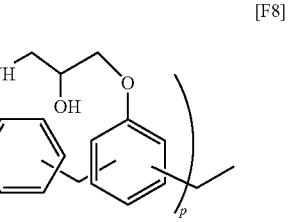

When the ratio is 40% or less, the compound having an amino group, which has been added through modification, prevents molecular alignment and crystallization of the epoxy resin having a polycyclic structure. Therefore, the resultant varnish exhibits favorable storage stability without causing recrystallization.

When the ratio exceeds 40%, curing reaction may proceed, and satisfactory storage stability may fail to be achieved.

Formula (2)

[F11]

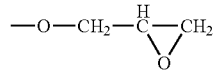

In the present invention, regarding the ratio of the compound having an amino group and/or the compound having a phenolic hydroxyl group to the epoxy resin having a polycyclic structure during reaction, the ratio of the amino group equivalent of the compound having an amino group and/or the hydroxyl group equivalent of the compound having a phenolic hydroxyl group to the epoxy equivalent of the epoxy resin is preferably 0.05 to 20, more preferably 0.10 to 10, particularly preferably 0.20 to 5. When the ratio of the reactive group equivalent of such a compound to the epoxy equivalent of the epoxy resin is 0.05 to 20, the effect of dissolving the epoxy resin having a polycyclic structure is not lowered, and favorable handling is achieved. When the equivalent ratio falls within the above range, and the ratio of the molar fraction of the structure of formula (1) to the sum of the molar fraction of the structure of formula (1) and that of the structure of formula (2) falls within the aforementioned range, the time required for synthesis can be shortened, and storage stability can be improved.

The varnish of the present invention may further contain, in the resin component, a structure represented by the following formula (10).

Formula (10)

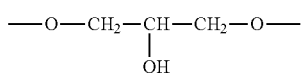

[F12]

When a structure represented by formula (10) is contained, in the resin component, the ratio of the sum of the molar fraction of the structures of formula (1) and formula (10) to the sum of the molar fraction of the structures of formula (1), formula (2), and formula (10) is preferably 40% or less, more preferably 1% to 40%, much more preferably 5% to 35%, particularly preferably 10% to 30%.

When the ratio is 40% or less, the compound having an amino group, which has been added through modification, prevents molecular alignment and crystallization of the epoxy resin having a polycyclic structure. Therefore, the resultant varnish exhibits favorable storage stability without causing recrystallization.

When the ratio exceeds 40%, curing reaction may proceed, and satisfactory storage stability may fail to be achieved.

When the ratio of the epoxy equivalent to the reactive group equivalent of the curing agent is adjusted to 0.8 to 1.2, the resultant varnish exhibits improved properties after curing.

Preferably, a solvent is added for mixing the epoxy resin having a polycyclic structure with the compound having an amino group and/or the compound having a phenolic hydroxyl group.

No particular limitation is imposed on the solvent employed, so long as it can dissolve a resin composition containing no solvent, the composition being produced through reaction between the epoxy resin having a polycyclic structure, the compound having an amino group, and the compound having a phenolic hydroxyl group. Particularly, acetone, methyl ethyl ketone, methyl butyl ketone, toluene, xylene, ethyl acetate, N,N-dimethylformamide, N,N-dimethylacetamide, ethanol, ethylene glycol monomethyl ether, propylene glycol monomethyl ether acetate, etc. are preferably employed, since such a solvent exhibits excellent solubility. Particularly preferably, propylene glycol monomethyl ether is employed, since it can dissolve a resin having high crystallinity.

No particular limitation is imposed on the amount of such a solvent employed, so long as the solvent can dissolve a resin composition containing no solvent, the composition being produced through reaction between the epoxy resin having a polycyclic structure, the compound having an amino group, and the compound having a phenolic hydroxyl group. The amount of the solvent employed is preferably 5 to 300 parts by mass, more preferably 30 to 200 parts by mass, on the basis of 100 parts by mass of the total amount of the resin component produced through reaction between the epoxy resin having a polycyclic structure, the compound having an amino group, and the compound having a phenolic hydroxyl group. The aforementioned solvents may be employed in any combination.

In the present invention, the weight average molecular weight of the resin component after reaction is preferably 800 to 4,000, more preferably 900 to 3,500, much more preferably 950 to 3,000. The weight average molecular weight of the compound contained in the varnish may be determined through, for example, GPC (gel permeation chromatography by use of a calibration curve based on standard polystyrene). When the weight average molecular weight of the compound contained in the varnish falls within the above range, the resin having a polycyclic structure exhibits improved solubility, and the varnish exhibits favorable handling property without causing precipitation of crystals.

The varnish of the present invention may optionally contain a resin or a curing agent in addition to the aforementioned component. No particular limitation is imposed on the curing agent employed, so long as it exhibits the effect of curing a thermosetting resin. Examples of the curing agent include acid anhydrides such as maleic anhydride and maleic anhydride copolymer, and phenolic compounds such as phenol novolak, cresol novolak, and aminotriazine novolak resins. These curing agents may be employed singly or in combination of two or more species.

During production of a laminate, a curing promoter may be added to the varnish of the present invention. Examples of the curing promoter include imidazoles and derivatives thereof, tertiary amines, and quaternary ammonium salts.

The varnish of the present invention may optionally contain an additional component, so long as the effects of the present invention are not impaired.

Examples of the additional component include flame retardants such as organic phosphorus flame retardants, organic nitrogen-containing phosphorus compounds, nitrogen compounds, silicone flame retardants, and metal hydroxides; organic fillers such as silicone powder, nylon powder, and fluorine compound powder; thickeners such as orben and benton; antifoaming agents or leveling agents such as silicone compounds, fluorine-containing compounds, and polymer compounds; adhesion-imparting agents such as imidazole-containing, thiazole-containing, triazole-containing, and silane-containing coupling agents; UV absorbents such as benzotriazole compounds; antioxidants such as hindered phenol compounds and styrenated phenol compounds; photopolymerization initiators such as benzophenone compounds, benzylketal compounds, and thioxanthone compounds; fluorescent brightening agents such as stilbene derivatives; and colorants such as phthalocyanine blue, phthalocyanine green, iodine green, disazo yellow, and carbon black.

The varnish of the present invention may contain an inorganic filler or an additive for the purpose of reducing thermal expansion coefficient or imparting flame retardancy, so long as the effects of the present invention are not impaired. Examples of the inorganic filler which may employed include silica, alumina, aluminum hydroxide, calcium carbonate, clay, talc, silicon nitride, boron nitride, titanium oxide, barium titanate, lead titanate, and strontium titanate. In order to prepare a homogenous material for forming the multi-layer wiring board of the present invention and to achieve favorable handling of the material, the amount of such an inorganic filler incorporated is adjusted to 300 parts by mass or less, preferably 200 parts by mass or less, on the basis of 100 parts by mass of the total amount of the resin component of the present invention containing no solvent.

In the case where the resin having a polycyclic structure is employed in the present invention, when a large amount of an inorganic filler is incorporated, a particular attention must be paid, since the inorganic filler may serve as a "crystalline nucleus" for promotion of crystallization. Examples of the additive which may be employed include various silane coupling agents, curing promoters, and antifoaming agents. In order to maintain properties of the resin composition, the amount of such an additive incorporated is preferably adjusted to 5 parts by mass or less, more preferably 3 parts by mass or less, on the basis of 100 parts by mass of the total amount of the resin component containing no solvent. Uniform dispersion of such an inorganic filler is effectively carried out by means of, for example, a grinder or a homogenizer.

In the present invention, reaction between the resin having a polycyclic structure and the compound having an amino group and/or the compound having a phenolic hydroxyl group is carried out preferably at 80° C. to 250° C., more preferably at 85° C. to 245° C., much more preferably at 90° C. to 240° C.

The reaction time is preferably 10 minutes to 30 hours, more preferably 30 minutes to 20 hours, much more preferably 1 to 15 hours.

When reaction is carried out under these conditions, there can be adjusted the molar fraction of the resin component represented by formula (1) in the varnish, or the molar fraction of the resin component represented by formula (1) and that of the structure represented by formula (9).

The varnish of the present invention can be suitably employed for forming an organic insulating layer upon production of a multi-layer printed wiring board or a package substrate. The varnish of the present invention may be applied to a circuit board for forming an insulating layer. However, industrially, the varnish is preferably employed as a material for producing a layered sheet such as an adhesive film or a prepreg.

[2] Prepreg, Resin-Coated Film, Metal-Foil-Clad Laminate, and Printed Wiring Board:

The resin-coated film of the present invention is produced by applying the varnish of the present invention to a support film; evaporating the solvent contained in the varnish through drying; and forming a resin composition layer through semi-curing (B-stage). An appropriate protective film may be provided on the resin composition layer.

Preferably, the state of semi-curing is maintained so that, during curing of the varnish, adhesion is secured between the resin composition layer and the substrate on which a conductor wiring pattern is formed, or the burying performance (fluidity) of the varnish with respect to the substrate having the conductor wiring pattern is secured.

Application of the varnish may be carried out by means of a coating machine such as a die coater, a comma coater, a bar coater, a kiss coater, or a roll coater. Such a coating machine is appropriately selected depending on the thickness of the resin-coated film. Drying may be carried out through, for example, heating or hot air blowing.

No particular limitation is imposed on the drying conditions, but drying is carried out so that the amount of the organic solvent contained in the resin composition layer is adjusted to generally 10 mass % or less, preferably 5 mass % or less. The drying conditions may vary with the amount of the organic solvent contained in the varnish or the boiling point of the organic solvent. The resin composition layer is formed by, for example, drying a varnish having an organic solvent content of 30 to 60 mass % at 50 to 150° C. for about 3 to about 10 minutes. Preferably, suitable drying conditions are appropriately determined on the basis of the results of simple preliminary experiments.

The thickness of the resin composition layer formed in the resin-coated film is generally equal to or greater than that of the conductor layer. The thickness of the conductor layer formed on the circuit board is preferably 5 to 70 µm. In order to reduce the weight, thickness, and size of the printed wiring board, the thickness of the conductor layer is more preferably 3 to 50 µm, most preferably 5 to 30 µm. Therefore, the thickness of the resin composition layer is preferably greater by 5% or more than that of the conductor layer.

Examples of the support film employed in the present invention include films formed from a polyolefin such as polyethylene, polypropylene, or polyvinyl chloride; a polyester such as polyethylene terephthalate (hereinafter may be referred to as "PET") or polyethylene naphthalate; polycarbonate; and polyimide; release paper; and metal foils such as copper foil and aluminum foil.

The support film or the below-described protective film may be subjected to mud treatment, corona treatment, or release treatment.

No particular limitation is imposed on the thickness of the support film, but the thickness is preferably 10 to 150 µm, more preferably 25 to 50 µm. A protective film corresponding to the support film may be further formed on the surface of the resin composition layer to which the support film does not adhere.

No particular limitation is imposed on the thickness of the protective film, and the thickness is, for example, 1 to 40 µm. Formation of the protective film can prevent contamination of the layer with foreign matter. The resin-coated film may be stored in a rolled form.

When the printed wiring board (multi-layer printed wiring board) of the present invention is produced from the resin-coated film of the present invention, for example, the resin-coated film is laminated on one surface or both surfaces of the circuit board by means of a vacuum laminator.

Examples of the substrate employed for forming the circuit board include a glass epoxy substrate, a metal substrate, a polyester substrate, a polyimide substrate, a BT resin substrate, and a thermosetting polyphenylene ether substrate.

As used herein, the term "circuit board" refers to a product including any of the aforementioned substrates and a conductor wiring (circuit) pattern formed on one surface or both surfaces of the substrate. The "circuit board" encompasses a multi-layer printed wiring board formed through alternate stacking of conductor layers and resin composition layers, wherein a conductor wiring (circuit) pattern is formed on one surface or both surfaces of the outermost layer of the multi-layer printed wiring board. The surface of the conductor wiring layer may be roughened in advance through, for example, blackening treatment.

When the conductor layer is formed on at least one surface of the resin-coated film, the resultant product is regarded as a metal-foil-clad laminate.

In the case where the resin-coated film has a protective film, in the aforementioned lamination process, after removal of the protective film, optionally, the resin-coated film and the circuit board are preliminarily heated, and the resin-coated film is press-bonded to the circuit board under pressurization and heating. In the present invention, preferably, the resin-coated film is laminated on the circuit board under reduced pressure through the vacuum lamination process.

No particular limitation is imposed on the lamination conditions, but, for example, the lamination process is preferably carried out under a reduced pressure which is a pressure equal to or lower than air pressure 20 mmHg (26.7 hPa) under the following conditions: press-bonding temperature (lamination temperature) of preferably 70 to 140° C., and press-bonding pressure of preferably 0.1 to 1.1 MPa. The lamination process may be of a batch type or a continuous type by means of a roller.

In the case where the resin-coated film is laminated on the circuit board, and then the support film is removed after cooling to around room temperature, the resin composition layer can be formed on the circuit board through thermal curing after removal of the film. The thermal curing conditions may be appropriately determined in consideration of, for example, the type of the resin component contained in the resin composition, or the amount of the resin component. The thermal curing process is preferably carried out at 150° C. to 220° C. for 20 minutes to 180 minutes, more preferably at 160° C. to 200° C. for 30 to 120 minutes.

In the case where the support film is not removed before the curing process, the support film is removed after formation of the resin composition layer. Subsequently, via holes or through-holes are optionally formed in the resin composition layer provided on the circuit board. Formation of holes may be carried out through any known means such as a drill, a laser, or a plasma, or optionally through combination of these means. Most generally, formation of holes is carried out by means of a laser such as carbon dioxide gas laser or YAG laser.

Subsequently, the conductor layer is formed on the resin composition layer through dry plating or wet plating. Dry plating may be carried out through any known technique such as vapor deposition, sputtering, or ion plating. When wet plating is carried out, firstly, the surface of the above-cured resin composition layer is roughened with an oxidizing agent such as a permanganate salt (e.g., potassium permanganate or sodium permanganate), a dichromate salt, ozone, hydrogen peroxide/sulfuric acid, or nitric acid, to thereby form uneven anchors. The oxidizing agent employed is particularly preferably an aqueous sodium hydroxide solution of, for example, potassium permanganate or sodium permanganate (alkaline aqueous permanganate solution). Next, the conductor layer is formed through combination of electroless plating and electroplating. Alternatively, the conductor layer may be formed only through electroless plating by use of a plating resist having a pattern reverse to that of the conductor layer. The subsequent conductor wiring formation process may be carried out through any known technique such as the subtractive method or the semi-additive method.

The prepreg of the present invention is produced by impregnating a fibrous sheet-like reinforcing substrate with the varnish of the present invention through the solvent method, followed by heating to the B-stage. That is, the prepreg can be produced through impregnation of a fibrous sheet-like reinforcing substrate with the varnish of the present invention.

The fibrous sheet-like reinforcing substrate may be, for example, any well-known one employed for various laminates for electric insulating material. Examples of the material of the reinforcing substrate include inorganic fibers such as E glass fiber, D glass fiber, S glass fiber, and Q glass fiber; organic fibers such as polyimide fiber, polyester fiber, and polytetrafluoroethylene fiber; and mixtures thereof.

Such a substrate is in the form of, for example, woven fabric, nonwoven fabric, roving, chopped strand mat, or surfacing mat. The material or shape of the substrate is determined in consideration of the intended use or performance of the resultant product. Optionally, a single material and shape may be employed, or two or more materials and shapes may be employed in combination. No particular limitation is imposed on the thickness of the substrate employed, and the thickness may be, for example, about 0.03 to about 0.5 mm. Preferably, the substrate is subjected to surface treatment with, for example, a silane coupling agent, or subjected to mechanical opening treatment, from the viewpoints of heat resistance, moisture resistance, and processability.

In the solvent method, the sheet-like reinforcing substrate is immersed in the varnish of the present invention, and the sheet-like reinforcing substrate is impregnated with the varnish, followed by drying.

Subsequently, the multi-layer printed wiring board is produced from the above-produced prepreg as follows. For example, a single prepreg of the present invention, or optionally a plurality of prepregs of the present invention are stacked on the circuit board, and the resultant product is sandwiched between metal plates via release films, followed by pressing under pressurized and heating conditions. Pressurization and heating are preferably carried out at 0.5 to 4 MPa and 120 to 200° C. for 20 to 100 minutes. Similar to the case of the resin-coated film, the prepreg may be laminated on the circuit board through the vacuum lamination process, and then curing may be carried out under heating. Thereafter, the surface of the thus-cured prepreg may be roughened in a manner similar to that described above, and then the conductor layer may be formed through plating, to thereby produce the multi-layer printed wiring board.

EXAMPLES

The present invention will next be described in detail by way of examples, which should not be construed as limiting the invention thereto.

Example 1

200 g of a dihydroanthracene epoxy resin (trade name: YX-8800, product of Japan Epoxy Resin, epoxy equivalent: 174 to 183), 13.8 g of benzoguanamine (product of Nippon Shokubai Co., Ltd.) serving as a compound having an amino group, 13.2 g of a cresol novolak resin (trade name: KA-1165, product of DIC Corporation, hydroxyl group equivalent: 119) serving as a compound having a phenolic hydroxyl group, and 170.2 g of propylene glycol monomethyl ether acetate (product of Kanto Chemical Co., Inc.) serving as a solvent were added to a four-neck separable flask equipped with a thermometer, a cooling tube, and a stirrer, and the resultant mixture was stirred under heating at 140° C. After confirmation that the materials were dissolved in the solvent, heating was further carried out for 10 minutes, and then 1 g of the resultant varnish was sampled. The weight average molecular weight of the varnish before reaction as reduced to polystyrene was determined through high-performance liquid chromatography (column: TSK-gel G-3000H, product of Tosoh Corporation). Subsequently, reaction was allowed to proceed at 140° C. for five hours, and then 1 g of the resultant varnish was sampled. The weight average molecular weight of the varnish as reduced to polystyrene was determined through high-performance liquid chromatography. Thereafter, 92.0 g of the cresol novolak resin (trade name: KA-1165, product of DIC Corporation) was added and dissolved under heating at 100° C. for 30 minutes, to thereby produce a varnish.

The thus-produced varnish was sampled in a volume of 1 mL. After confirmation that particles having a size of 5 μm or more were absent in the varnish by means of a particle gauge, the varnish was stored at 5° C., and the varnish was visually observed for determining the time elapsed until precipitation of the materials in the varnish. When precipitation of the materials was observed, 1 mL of the varnish was sampled, and the presence or absence of particles having a size of 5 μm or more was determined by means of a particle gauge. The time elapsed until confirmation of the presence of particles having a size of 5 μm or more was regarded as the "storage time" of the varnish.

Example 2

The procedure of Example 1 was repeated, except that the amount of benzoguanamine (product of Nippon Shokubai Co., Ltd.) was changed to 27.6 g; the amount of the cresol novolak resin (trade name: KA-1165, product of DIC Corporation) was changed to 22.6 g; the amount of propylene glycol monomethyl ether acetate (product of Kanto Chemical Co., Inc.) was changed to 162.8 g; and the amount of the cresol novolak resin (trade name: KA-1165, product of DIC Corporation) added after reaction was changed to 56.3 g, to thereby produce a varnish. The storage time of the varnish was determined.

Example 3

The procedure of Example 1 was repeated, except that 4.6 g of melamine (product of Kanto Chemical Co., Inc.) was employed as a compound having an amino group; the amount of the cresol novolak resin (trade name: KA-1165, product of DIC Corporation) serving as a compound having a phenolic hydroxyl group was changed to 26.2 g; the amount of propylene glycol monomethyl ether acetate (product of Kanto Chemical Co., Inc.) was changed to 172.2 g; and the amount of the cresol novolak resin (trade name: KA-1165, product of DIC Corporation) added after reaction was changed to 46.0 g, to thereby produce a varnish. The storage time of the varnish was determined.

Example 4

The procedure of Example 1 was repeated, except that 11.6 g of dicyandiamide (product of Kanto Chemical Co., Inc.) was employed as a compound having an amino group; the amount of propylene glycol monomethyl ether acetate (product of Kanto Chemical Co., Inc.) serving as a solvent was changed to 118.8 g; the amount of the cresol novolak resin (trade name: KA-1165, product of DIC Corporation) added after reaction was changed to 65.8 g; and the reaction time at 140° C. was changed to three hours, to thereby produce a varnish. The storage time of the varnish was determined.

Example 5

The procedure of Example 1 was repeated, except that 2.4 g of dicyandiamide (product of Kanto Chemical Co., Inc.) was employed; the amount of the cresol novolak resin (trade name: KA-1165, product of DIC Corporation) was changed to 26.2 g; the amount of propylene glycol monomethyl ether acetate (product of Kanto Chemical Co., Inc.) was changed to 137.4 g; and the amount of the cresol novolak resin (trade name: KA-1165, product of DIC Corporation) added after reaction was changed to 46.0 g, to thereby produce a varnish. The storage time of the varnish was determined.

Example 6

The procedure of Example 1 was repeated, except that 200 g of a naphthalene novolak epoxy resin (trade name: ESN-175, product of Tohto Kasei Co., Ltd., epoxy equivalent: 254) was employed; 3.3 g of dicyandiamide (product of Kanto Chemical Co., Inc.) was employed; 24.8 g of a phenol novolak resin (trade name: TD-2090, product of DIC Corporation, hydroxyl group equivalent: 105) was employed as a compound having a phenolic hydroxyl group; the amount of propylene glycol monomethyl ether acetate (product of Kanto Chemical Co., Inc.) was changed to 115.5 g; the amount of the phenol novolak resin (trade name: TD-2090, product of DIC Corporation) added after reaction was changed to 41.3 g; and the reaction time at 140° C. was changed to three hours, to thereby produce a varnish. The storage time of the varnish was determined.

Example 7

The procedure of Example 1 was repeated, except that 76.8 g of a biphenyl novolak epoxy resin (trade name: NC-3000-H, product of Nippon Kayaku Co., Ltd., epoxy equivalent: 284 to 294) was employed in addition to the dihydroanthracene epoxy resin; 62.6 g of aminotriazine novolak (trade name: LA3018-50P, product of DIC Corporation, 50% solution) was employed as a compound having an amino group; the amount of the cresol novolak resin (trade name: KA-1165, product of DIC Corporation) serving as a compound having a phenolic hydroxyl group was changed to 14.8 g; the amount of propylene glycol monomethyl ether acetate (product of Kanto Chemical Co., Inc.) was changed to 230.5 g; the amount of the cresol novolak resin (trade name: KA-1165, product of DIC Corporation) added after reaction was changed to 124.9 g; the reaction temperature was changed to 120° C.; and the retention time was changed to 14 hours, to thereby produce a varnish. The storage time of the varnish was determined.

Example 8

The procedure of Example 1 was repeated, except that 76.8 g of a biphenyl novolak epoxy resin (trade name: NC-3000-H, product of Nippon Kayaku Co., Ltd., epoxy equivalent: 284 to 294) was employed in addition to the dihydroanthracene epoxy resin; 3.8 g of dicyandiamide (product of Kanto Chemical Co., Inc.) was employed as a compound having an amino group; the amount of the cresol novolak resin (trade name: KA-1165, product of DIC Corporation) serving as a compound having a phenolic hydroxyl group was changed to 18.1 g; the amount of propylene glycol monomethyl ether acetate (product of Kanto Chemical Co., Inc.) was changed to 113.0 g; the amount of the cresol novolak resin (trade name: KA-1165, product of DIC Corporation) added after reaction was changed to 124.9 g; and the amount of propylene glycol monomethyl ether acetate (product of Kanto Chemical Co., Inc.) added after reaction was changed to 115.1 g, to thereby produce a varnish. The storage time of the varnish was determined.

Example 9

The procedure of Example 1 was repeated, except that 200.5 g of a biphenyl novolak epoxy resin (trade name: NC-3000-H, product of Nippon Kayaku Co., Ltd., epoxy equivalent: 284 to 294) was employed in addition to the dihydroanthracene epoxy resin; 3.9 g of dicyandiamide (product of Kanto Chemical Co., Inc.) was employed as a compound having an amino group; the amount of the cresol novolak resin (trade name: KA-1165, product of DIC Corporation) serving as a compound having a phenolic hydroxyl group was changed to 197.2 g; the amount of propylene glycol monomethyl ether acetate (product of Kanto Chemical Co., Inc.) was changed to 161.6 g; and 164.7 g of propylene glycol monomethyl ether acetate (product of Kanto Chemical Co., Inc.) was added after reaction, to thereby produce a varnish. The storage time of the varnish was determined.

Comparative Example 1

200 g of a dihydroanthracene epoxy resin (trade name: YX-8800, product of Japan Epoxy Resin), 13.8 g of benzoguanamine (product of Nippon Shokubai Co., Ltd.) serving as a compound having an amino group, 105.2 g of a cresol novolak resin (trade name: KA-1165, product of DIC Corporation) serving as a compound having a phenolic hydroxyl group, and 170.2 g of propylene glycol monomethyl ether acetate (product of Kanto Chemical Co., Inc.) serving as a solvent were added to a four-neck separable flask equipped with a thermometer, a cooling tube, and a stirrer, and the resultant mixture was stirred under heating at 140° C., to thereby produce a varnish.

The thus-produced varnish was sampled in a volume of 1 mL. After confirmation that particles having a size of 5 μm or more were absent in the varnish by means of a particle gauge, the varnish was stored at 5° C., and the varnish was visually observed for determining the time elapsed until precipitation of the materials in the varnish. When precipitation of the materials was observed, 1 mL of the varnish was sampled, and the presence or absence of particles having a size of 5 μm or more was determined by means of a particle gauge. The time elapsed until confirmation of the presence of particles having a size of 5 μm or more was regarded as the "storage time" of the varnish.

Comparative Example 2

The procedure of Comparative Example 1 was repeated, except that the amount of benzoguanamine (product of Nippon Shokubai Co., Ltd.) was changed to 27.6 g; the amount of the cresol novolak resin (trade name: KA-1165, product of DIC Corporation) was changed to 78.9 g; and the amount of propylene glycol monomethyl ether acetate (product of Kanto Chemical Co., Inc.) was changed to 162.8 g, to thereby produce a varnish. The storage time of the varnish was determined.

Comparative Example 3

The procedure of Comparative Example 1 was repeated, except that 4.6 g of melamine (product of Kanto Chemical Co., Inc.) was employed as a compound having an amino group; the amount of the cresol novolak resin (trade name: KA-1165, product of DIC Corporation) was changed to 72.2 g; and the amount of propylene glycol monomethyl ether acetate (product of Kanto Chemical Co., Inc.) was changed to 172.2 g, to thereby produce a varnish. The storage time of the varnish was determined.

Comparative Example 4

The procedure of Comparative Example 1 was repeated, except that 11.6 g of dicyandiamide (product of Kanto Chemical Co., Inc.) was employed; the amount of the cresol novolak resin (trade name: KA-1165, product of DIC Corporation) was changed to 65.8 g; and the amount of propylene glycol monomethyl ether acetate (product of Kanto Chemical Co., Inc.) serving as a solvent was changed to 118.8 g, to thereby produce a varnish. The storage time of the varnish was determined.

Comparative Example 5

The procedure of Comparative Example 1 was repeated, except that 2.4 g of dicyandiamide (product of Kanto Chemical Co., Inc.) was employed as a compound having an amino group; the amount of the cresol novolak resin (trade name: KA-1165, product of DIC Corporation) was changed to 72.2 g; and the amount of propylene glycol monomethyl ether acetate (product of Kanto Chemical Co., Inc.) was changed to 137.4 g, to thereby produce a varnish. The storage time of the varnish was determined.

Comparative Example 6

The procedure of Comparative Example 1 was repeated, except that 200 g of a naphthalene novolak epoxy resin (trade name: ESN-175, product of Tohto Kasei Co., Ltd.) was employed; 3.3 g of dicyandiamide (product of Kanto Chemical Co., Inc.) was employed as a compound having an amino group; 65.0 g of a phenol novolak resin (trade name: TD-2090, product of DIC Corporation) was employed as a compound having a phenolic hydroxyl group; and the amount of propylene glycol monomethyl ether acetate (product of Kanto Chemical Co., Inc.) was changed to 115.5 g, to thereby produce a varnish. The storage time of the varnish was determined.

Comparative Example 7

The procedure of Comparative Example 1 was repeated, except that 76.8 g of a biphenyl novolak epoxy resin (trade name: NC-3000-H, product of Nippon Kayaku Co., Ltd., epoxy equivalent: 284 to 294) was employed in addition to the dihydroanthracene epoxy resin; 62.6 g of aminotriazine novolak (trade name: LA3018-50P, product of DIC Corporation, 50% solution) was employed as a compound having an amino group; the amount of the cresol novolak resin (trade name: KA-1165, product of DIC Corporation) serving as a compound having a phenolic hydroxyl group was changed to 139.7 g; and the amount of propylene glycol monomethyl ether acetate (product of Kanto Chemical Co., Inc.) was changed to 230.5 g, to thereby produce a varnish. The storage time of the varnish was determined.

Comparative Example 8

The procedure of Comparative Example 1 was repeated, except that 76.8 g of a biphenyl novolak epoxy resin (trade name: NC-3000-H, product of Nippon Kayaku Co., Ltd., epoxy equivalent: 284 to 294) was employed in addition to the dihydroanthracene epoxy resin; 3.8 g of dicyandiamide (product of Kanto Chemical Co., Inc.) was employed as a compound having an amino group; the amount of the cresol novolak resin (trade name: KA-1165, product of DIC Corporation) serving as a compound having a phenolic hydroxyl group was changed to 143.0 g; and the amount of propylene glycol monomethyl ether acetate (product of Kanto Chemical Co., Inc.) was changed to 228.1 g, to thereby produce a varnish. The storage time of the varnish was determined.

Comparative Example 9

The procedure of Comparative Example 1 was repeated, except that 200.5 g of a biphenyl novolak epoxy resin (trade name: NC-3000-H, product of Nippon Kayaku Co., Ltd., epoxy equivalent: 284 to 294) was employed in addition to the dihydroanthracene epoxy resin; 3.9 g of dicyandiamide (product of Kanto Chemical Co., Inc.) was employed as a compound having an amino group; the amount of the cresol novolak resin (trade name: KA-1165, product of DIC Corporation) serving as a compound having a phenolic hydroxyl group was changed to 197.2 g; and the amount of propylene glycol monomethyl ether acetate (product of Kanto Chemical Co., Inc.) was changed to 326.3 g, to thereby produce a varnish. The storage time of the varnish was determined.

Table 1 shows the weight average molecular weights of the varnishes produced in the Examples, and the results of measurement of the storage times of the varnishes. Table 2 shows the results of measurement of the storage times of the varnishes produced in the Comparative Examples.

TABLE 1

| Component | Material name | Product name | Unit | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|---|---|---|
| Epoxy resin | Dihydroanthracene epoxy resin | YX-8800 | g | 200.0 | 200.0 | 200.0 | 200.0 | 200.0 | | 200 | 200 | 200 |
| | Naphthalene novolak epoxy resin | ESN-175 | g | | | | | | 200.0 | | | |
| | Biphenyl novolak epoxy resin | NC-3000-H | g | | | | | | | 76.8 | 76.8 | 200.5 |
| Curing agent | Benzoguanamine | — | g | 13.8 | 27.6 | | | | | | | |
| | Melamine | — | g | | | 4.6 | | | | | | |
| | Dicyandiamide | — | g | | | | 11.6 | 2.4 | 3.3 | | 3.8 | 3.9 |
| | Aminotriazine novolak resin | LA-3018 | g | | | | | | | 62.6 | | |
| | Cresol novolak resin | KA-1165 | g | 13.2 | 22.6 | 26.2 | | 26.2 | | 14.8 | 18.1 | 197.2 |
| | Cresol novolak resin after reaction | KA-1165 | g | 92.0 | 56.3 | 46.0 | 65.8 | 46.0 | | 124.9 | 124.9 | |
| | Phenol novolak resin | TD-2090 | g | | | | | | 24.8 | | | |
| | Phenol novolak resin after reaction | TD-2090 | g | | | | | | 41.3 | | | |
| Solvent | Propylene glycol monomethyl ether acetate | — | g | 170.2 | 162.8 | 172.2 | 118.8 | 137.4 | 115.5 | 230.5 | 113.0 | 161.6 |
| | Propylene glycol monomethyl ether acetate after reaction | | | | | | | | | | 115.1 | 164.7 |
| Weight average molecular weight | Before reaction | | | 638 | 645 | 566 | 612 | 570 | 598 | 490 | 632 | 1916 |
| | After reaction | | | 1122 | 1318 | 912 | 824 | 982 | 1093 | 1023 | 975 | 3536 |
| | Storage time | | Hrs | >168 | >168 | >168 | >168 | >168 | >168 | >168 | >168 | >168 |

TABLE 2

| Component | Material name | Product name | Unit | Comp. Ex. 1 | Comp. Ex. 2 | Comp. Ex. 3 | Comp. Ex. 4 | Comp. Ex. 5 | Comp. Ex. 6 | Comp. Ex. 7 | Comp. Ex. 8 | Comp. Ex. 9 |
|---|---|---|---|---|---|---|---|---|---|---|---|---|
| Epoxy resin | Dihydroanthracene epoxy resin | YX-8800 | g | 200.0 | 200.0 | 200.0 | 200.0 | 200.0 | | 200 | 200 | 200 |
| | Naphthalene novolak epoxy resin | ESN-175 | g | | | | | | 200.0 | | | |
| | Biphenyl novolak epoxy resin | NC-3000-H | g | | | | | | | 76.8 | 76.8 | 200.5 |
| Curing agent | Benzoguanamine | — | g | 13.8 | 27.6 | | | | | | | |
| | Melamine | — | g | | | 4.6 | | | | | | |
| | Dicyandiamide | — | g | | | | 11.6 | 2.4 | 3.3 | | 3.8 | 3.9 |
| | Aminotriazine novolak resin | LA-3018 | g | | | | | | | 62.6 | | |
| | Cresol novolak resin | KA-1165 | g | 105.2 | 78.9 | 72.2 | 65.8 | 72.2 | | 139.7 | 143.0 | 197.2 |
| | Phenol novolak resin | TD-2090 | g | | | | | | 65.0 | | | |
| Solvent | Propylene glycol monomethyl ether acetate | — | g | 170.2 | 162.8 | 172.2 | 118.8 | 137.4 | 115.5 | 230.5 | 228.1 | 326.3 |
| | Storage time | | Hrs | 2 | 2 | 3 | 2 | 5 | 3 | 5 | 3 | 12 |

As shown in Table 1, the storage time of each of the varnishes of Examples 1 to 6 is 168 hours or longer; i.e., one week or longer. In contrast, as shown in Table 2, the storage time of each of the varnishes of Comparative Examples 1 to 6 is as short as 2 to 5 hours. The epoxy resin having a polycyclic structure employed in each of the Examples and the Comparative Examples is called "crystalline epoxy resin," and the epoxy resin exhibits low solubility in a solvent. Therefore, even in the case where the varnish is melted by heating to a temperature equal to or higher than the melting point of the epoxy resin, when the varnish is cooled to room temperature, the resin precipitates in the varnish within a short period of time. In contrast, in the cases of Examples 1 to 6, a portion of a plurality of the functional group of the epoxy resin is caused to react with the amino group or hydroxyl group of the curing agent, whereby, even when the resultant varnish is stored at 5° C., the storage time of the varnish becomes 30 times or more that of the varnishes of the Comparative Examples. Thus, reaction between a portion of a plurality of the functional group of the epoxy resin having a polycyclic structure and the amino group or hydroxyl group of the curing agent is important for securing the storage time of the varnish. Unlike the case of a conventional varnish, each of the varnishes of the Examples exhibits improved solubility and high stability. In addition, the varnish can be stored for a long period of time; i.e., the varnish exhibits excellent workability and high storage stability.

When a copper-clad laminate is produced from each of the varnishes of the Examples, the laminate exhibits low thermal expansion coefficient. Therefore, when a printed wiring board is produced from the laminate, the wiring board can be prevented from occurrence of warpage, which poses problems in a conventional printed wiring board.

DESCRIPTION OF REFERENCE NUMERALS

10: Semiconductor chip
12: Sealing material (semiconductor package)
14: Bonding wire
16: Semiconductor package substrate
18: Substrate
20: Through-hole
22: Solder ball
C: Cracking caused by warpage

The invention claimed is:

1. A production method for producing a varnish, comprising reacting a compound having an amino group and a resin having a plurality of epoxy groups, and having at least one polycyclic structure selected from the group consisting of a structure formed through condensation of aromatic rings, a biphenyl novolak structure, or a terphenyl structure, wherein a portion of the plurality of the epoxy groups of the resin is caused to react with the amino group of the compound in an organic solvent, to form a reaction product having a weight average molecular weight in the range of 800 to 4000.

2. The production method according to claim 1, further comprising reacting a compound having a phenolic hydroxyl group and the resin, wherein another portion of the plurality of the epoxy groups of the resin is caused to react with the phenolic hydroxyl group of the compound in the organic solvent.

3. The production method according to claim 2, wherein the compound having a phenolic hydroxyl group is a phenol novolak resin or a cresol novolak resin.

4. The production method according to claim 1, wherein the compound having an amino group is any of guanamine, dicyandiamide, and aminotriazine novolak.

5. The production method according to claim 1, wherein the resin has at least one structure selected from the group consisting of a naphthalene structure, the biphenyl novolak structure, an anthracene structure, and a dihydroanthracene structure.

6. The production method according to claim 1, the varnish containing a resin component having a structure represented by the following formula (1):

Formula (1)

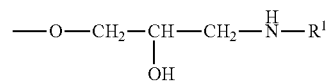

wherein $R^1$ represents the residue of a compound having an amino group.

7. The production method according to claim 6, wherein the ratio of the molar fraction of the structure represented by formula (1) to the sum of the molar fraction of the structure represented by formula (1) and that of a structure represented by the following formula (2):

Formula (2)

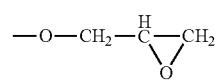

is 40% or less.

8. A prepreg produced by applying, to a substrate, a varnish produced by the production method as recited in claim 6, and drying the resultant product under heating.

9. A resin-coated film produced by applying, to a film, a varnish produced by the production method as recited in claim 6, and drying the resultant product under heating.

10. A prepreg produced by applying, to a substrate, a varnish produced by the production method as recited in claim 1, and drying the resultant product under heating.

11. A prepreg according to claim 10, wherein the substrate is a glass woven fabric, a glass nonwoven fabric, an aramid woven fabric, or an aramid nonwoven fabric.

12. A metal-foil-clad laminate comprising a prepreg as recited in claim 10 and a conductor layer provided on at least one surface of the prepreg.

13. A printed wiring board produced by forming a wiring pattern on the conductor layer provided on at least one surface of a metal-foil-clad laminate as recited in claim 12.

14. A resin-coated film produced by applying, to a film, a varnish produced by the production method as recited in claim 1, and drying the resultant product under heating.

15. A metal-foil-clad laminate comprising a resin-coated film as recited in claim 14, and a conductor layer provided on at least one surface of the film.

16. The production method according to claim 1, wherein the resin has at least one structure selected from the group consisting of the biphenyl novolak structure, a naphthalene structure, a naphthalene novolak structure, an anthracene structure, and a dihydroanthracene structure.

17. A production method for producing a varnish, comprising reacting a compound having a phenolic hydroxyl group and a resin having a plurality of epoxy groups, and having at least one polycyclic structure selected from the group consisting of a structure formed through condensation of aromatic rings, a biphenyl novolak structure, or a terphenyl structure, wherein a portion of the plurality of the epoxy groups of the resin is caused to react with the phenolic hydroxyl group of the compound in an organic solvent to form a reaction product having a weight average molecular weight in the range of 800 to 4000.

18. The production method according to claim 17, wherein the compound having a phenolic hydroxyl group is a phenol novolak resin or a cresol novolak resin.

19. The production method according to claim 17, wherein the resin has at least one structure selected from the group consisting of a naphthalene structure, the biphenyl novolak structure, an anthracene structure, and a dihydroanthracene structure.

20. A prepreg produced by applying, to a substrate, a varnish produced by the production method as recited in claim 17, and drying the resultant product under heating.

21. A resin-coated film produced by applying, to a film, a varnish produced by the production method as recited in claim 17, and drying the resultant product under heating.

22. The production method according to claim 17, wherein the resin has at least one structure selected from the group consisting of the biphenyl novolak structure, a naphthalene structure, a naphthalene novolak structure, an anthracene structure, and a dihydroanthracene structure.

* * * * *